United States Patent [19]

Shahriary et al.

[11] Patent Number: 4,918,748
[45] Date of Patent: Apr. 17, 1990

[54] APPARATUS AND METHOD FOR PHASE NOISE AND POST TUNING DRIFT CANCELLATION

[75] Inventors: Iradj Shahriary, Santa Monica; Kevin M. McNab, Redondo Beach, both of Calif.

[73] Assignee: Hughes Aircraft Company, Los Angeles, Calif.

[21] Appl. No.: 118,902

[22] Filed: Nov. 9, 1987

[51] Int. Cl.$^4$ .......................... H04B 1/26; H04B 1/10
[52] U.S. Cl. .................................... 455/315; 455/317; 455/316; 455/310; 455/209
[58] Field of Search ............... 455/315, 317, 316, 310, 455/311, 302, 189, 207, 208, 209, 258, 259, 255

[56] References Cited

U.S. PATENT DOCUMENTS 4,340,974 7/1982 Cooke et al. .................... 455/258
4,553,264 11/1985 Hasegawa et al. ............. 455/315 X
4,696,056 9/1987 Morita .............................. 455/316 X

FOREIGN PATENT DOCUMENTS 61-78250 4/1986 Japan ................................... 455/316

Primary Examiner—Robert L. Griffin
Assistant Examiner—Ralph Smith
Attorney, Agent, or Firm—Steven M. Mitchell; Wanda Denson-Low

[57] ABSTRACT

The tuner section of a communications receiver 10 includes a gallium arsenide voltage controlled oscillator 48 for upconverting the received signal in mixer 18. Phase noise and post tuning drift associated with oscillator 48 is impressed onto the signal supplied by a second oscillator network 46. Thus, the outputs of mixers 18 and 78 both contain noise and post tuning drift associated with the gallium arsenide oscillator 48. Mixer 28 is used to substract the noise and drift component on line 30 from that on line 32 to thereby provide an output 14 which is substantially free of the noise and drift associated with the efficient, but noisy gallium arsenide VCO 48.

15 Claims, 1 Drawing Sheet

APPARATUS AND METHOD FOR PHASE NOISE AND POST TUNING DRIFT CANCELLATION

TECHNICAL FIELD

This invention relates to multi-conversion communication receivers and, more particularly, to a technique for cancelling the phase noise and post tuning drift in such receivers.

DISCUSSION

Multi-conversion communication receivers are used in a wide variety of different applications including satellite command receivers, satellite transponder receivers, ground telemetry receivers, ground tracking receivers, land-based receivers, sea-based receivers and air-based receivers. The multi-conversion receiver typically includes at least two frequency synthesizers employing local oscillators for upconverting and downconverting some portion of the received signal. These frequency synthesizers generally fall into three primary categories: (1) direct analog, (2) indirect analog (PLL) (an abbreviation for phase locked loop) and (3) direct, digital (DDS) (an abbreviation for direct digital synthesizer). Much of the development for low noise super high frequency (SHF) and extra high frequency (EHF) synthesizer equipment has been drawn to the architectures in categories (1) and (2). Direct analog frequency synthesis generally consist of developing fixed, spectrally pure tones from a comb generator usually involving a step recovery snap diode. These tones are then separated in a microwave multiplexer or filter bank and selected via a microwave switch matrix. By selecting different combinations of tones and subsequently mixing these tones, multiple frequencies can be generated with relatively low phase noise. Unfortunately, this technique has several disadvantages. For example, it tends to have poor spurious performance because many tones are present simultaneously at the output of the comb generator. In addition, performance is degraded because of the multitude of RF components usually necessary to complete the circuitry. Also, the use of this technique tends to be very hardware intensive and is difficult to achieve the advantageous objectives of low size, weight and power performance.

On the other hand, indirect analog architectures using phase locked loops are generally much more desirable than direct analog types due to compactness, low power consumption and better spurious performance. At SHF and EHF frequencies, PLL's must generally employ either yttrium-iron-garnet (YIG) devices or gallium-arsenide field effect transistors (GaAs FETs) as major components in the voltage controlled oscillator (VCO) circuitry found in PLL's. Although GaAs devices can be monolithically integrated and consume relatively small amounts of power, they exhibit extremely poor noise performance approximating three orders of magnitude worse than silicon devices; they also exhibit poor post tuning drift characteristics due to higher thermal resistance of GaAs varactors. While YIG devices have better noise performance, they are bulky and consume relatively large amounts of DC power.

SUMMARY OF THE INVENTION

In accordance with the teachings of the present invention, it becomes possible to utilize high noise components such as GaAs devices in a multi-conversion receiver that has first and second local oscillators for upconverting and downconverting the received signal. The high noise device forms part of the first local oscillator and provision is made for impressing the frequency, noise, and post tuning drift generated thereby onto the received signal. Means are also provided for impressing the noise and drift generated by the first local oscillator onto the frequency generated by the second local oscillator. Then, the noise and drift impressed frequency from the second local oscillator is subtracted from the noise and drift impressed received signal. Accordingly, the resultant receiver output is substantially free of the noise and drift created by the first local oscillator thereby permitting the use of efficient but noisy components therein such as GaAs devices.

DESCRIPTION OF THE DRAWING

The various advantages of the present invention will become apparent to those skilled in the art upon a study of the drawing in which.

DESCRIPTION OF THE PREFERRED EMBODIMENT

Figure 1:
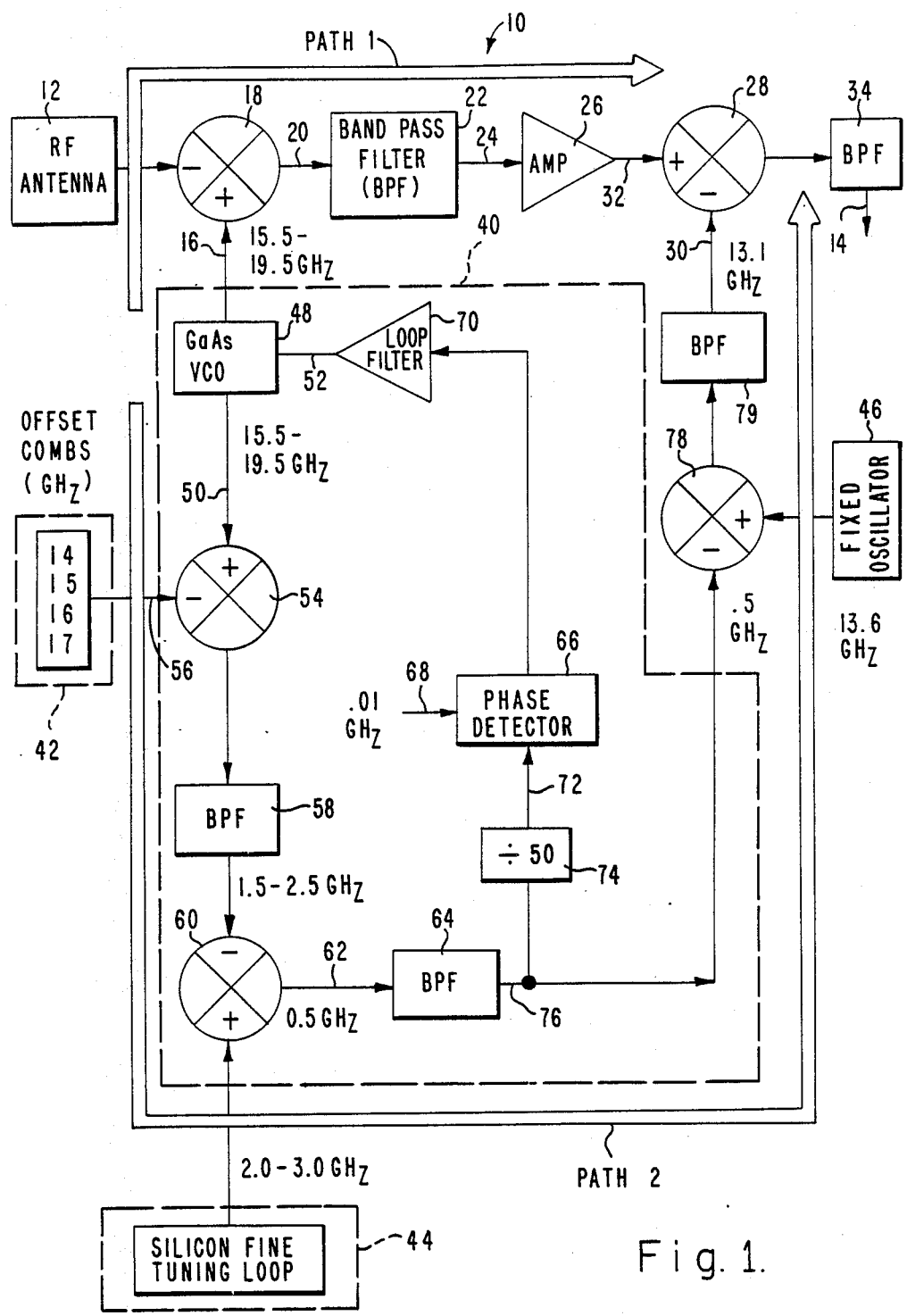
FIG. 1 is a schematic diagram of circuitry for carrying out the preferred embodiment of this invention.

The drawing illustrates the tuner section of a dual conversion receiver generally designated by the numeral 10. Receiver 10 is typically coupled to a communications antenna 12 and serves to mix the incoming signal with at least two different frequencies. In particular, receiver 10 serves to mix the incoming signal with a frequency provided by a first frequency synthesizer having a first local oscillator so as to upconvert the received signal. The receiver also includes a second frequency synthesizer circuit having a second local oscillator for downconverting the previously mixed signal to provide an output 14 which is typically connected to modulation detection circuitry for the purpose of baseband signal processing.

In the preferred embodiment of this invention, the first frequency synthesizer provides an input on line 16 to a double balanced mixer 18. Mixer 18 is of a conventional design that provides at its output 20 the sum and differences of the two input frequencies. For example, mixer 18 will provide on line 20 the sum of the frequencies associated with the receive signal from antenna 12 and the upconversion frequency signal on line 16 as well as the difference therebetween. Either the sum or difference of the two frequencies is then typically filtered by a suitable band pass filter 22 so that its output on line 24 contains the frequency of interest. This signal is then amplified by a suitable amplifier 26 whose output is coupled to an input of another similar double balanced mixer 28. The other input to mixer 28 is from a second frequency synthesizer whose output is supplied on line 30.

As will appear, mixer 28 and an associated band pass filter 34 serve to subtract the signal on line 30 from that on line 32 to provide the output 14 for the receiver. For ease in explanation, the inputs to the mixers have been labeled with "+" and "−" signs to indicate the desired resultant output after being filtered. For example, the output of mixer 18 and filter 22 on line 24 is the frequency on line 16 less the frequency from antenna 12. Similarly, the output of the mixer 28/filter 34 combination is the signal on line 32 less the signal on line 30.

Thus, the output 14 is upconverted via mixer 18 and downconverted via mixer 28.

By way of a specific example, the first frequency synthesizer consists of a phase lock loop network 40, an offset comb generator 42 and a silicon fine tuning loop 44. The second frequency synthesizer consists of a fixed local oscillator 46.

The PLL 40 includes a voltage controlled oscillator 48 having at least one gallium arsenide (GaAs) field effect transistor therein. GaAs oscillators are known in the art and, consequently, they need not be described in detail herein. Briefly, GaAs oscillator 48 provides an output on line 50 and line 16 having a frequency which is a function of the voltage applied on input line 52. In this particular embodiment, GaAs oscillator 48 has two outputs 16 and 50 each providing identical frequencies ranging from 15.5 to 19.5 gigahertz (GHz). The output 50 from oscillator 48 is connected to an input of another mixer 54. The other input to mixer 54 is connected to an output 56 of comb generator 42 which selectively provides frequencies, in this example, of 14, 15, 16 and 17 gigahertz. As will appear, the output of band pass filter 58 will range between 1.5 and 2.5 gigahertz. Its output is coupled to an input of still another mixer 60 whose other input is connected to the output of silicon fine tuning loop 44. Loop 44 can be any suitable circuitry for providing a selected range of frequencies which, in this example, consist of frequencies between 2-3 gigahertz. Preferably, loop 44 is a PLL including a voltage controlled oscillator made of silicon components which inherently have very low noise and low drift characteristics. Silicon voltage controlled oscillators can be used for loop 44 because it is not necessary for it to provide the very high frequencies of the PLL loop 40 which provides coarse tuning capability. Preferably, loop 44 generates frequencies less than 1/5 of that generated by the GaAs VCO 48.

The output of mixer 60 on line 62 is connected to an associated band pass filter 64 which rejects the unwanted frequency spectrum, here the summation output from mixer 60.

Completing the PLL 40, a conventional phase detector 66 has a control input 68 onto which a preselected lock frequency is applied. The output of phase detector 66 is coupled through a suitable loop filter 70 to the control output 52 of VCO 48. As is known in the art, the output of phase detector 66 will cause a change in the output frequency of VCO 48 until the other input 72 to phase detector 66 matches the lock frequency on input 68. In this particular embodiment, input 72 is connected through a divider 74 which divides the output frequency from filter 64 by fifty (50).

The output 76 of the band pass filter 64 is also coupled to a mixer 78 which operates in the same manner as the other mixers previously described. The other input to mixer 78 is from the second local oscillator which provides a fixed input frequency which in this specific example is 13.6 gigahertz. Since local oscillator 46 need only provide a fixed frequency, it can be constructed of comparatively low noise silicon components.

The output of mixer 78 thus consists of the local oscillator 46 frequency onto which the signal on line 76 from the PLL 40 has been impressed. As will be described, the signal on line 76 contains a constant 0.5 gigahertz frequency signal plus the noise and post tuning drift generated in the PLL 40 and fine tuning loop 44. The majority of this noise and drift comes from the gallium arsenide VCO 48. This noise and drift is also present on line 32 to mixer 28. Thus, the noise and drift component of the signal on line 30 is used to subtract the noise and drift component of the signal on line 32 in mixer 28. Consequently, the majority of the phase noise and post tuning drift in the tuner section of the receiver 10 is canceled.

The operation of the present invention can best be understood by way of a specific example. Assume that the outputs from GaAs VCO 48 and offset comb generator 42 are initially 15.5 and 14 gigahertz, respectively. Now, the output of the fine tuning loop is increased from 2 to 2.1 gigahertz. This causes an initial "out of lock" condition in PLL 40 causing VCO 48 to increment its output 50 until the frequency on line 76 reaches its "in lock" frequency of 0.5 gigahertz (this is the frequency that must be generated to satisfy the "in lock" conditions of the PLL 40 since the signal on line 76 is divided by 50 via divider 74, i.e., 0.5 GHz divided by 50 yields the lock frequency of 0.01 GHz applied to input 68). Under these conditions, the output 50 from VCO 48 must change to 15.6 gigahertz. Since the VCO 48 also applies its output on line 16, the 15.6 gigahertz signal is impressed upon the received signal by the action of mixer 18. Since the frequency on line 30 remains substantially constant, the output of mixer 28 is a function of the variable VCO 48 output 16 and the input from antenna 12. Thus, the receiver input can be tuned to a wide range of frequencies based upon the tunability of VCO output 16. The fine tuning loop 44 can be incremented in small frequency increments from 2 to 3 gigahertz thereby resulting in a proportional 48 VCO output change between 15.5 and 16.5 gigahertz. Then, the next incremental offset comb frequency is used (here, 15 gigahertz) with the silicon fine tuning loop 44 returning to its 2.0 gigahertz starting point. Small increases in the tuner output 14 are generated by incrementing the frequency generated by fine tuning loop 44 resulting in VCO 48 output changes from 16.5 to 17.5 gigahertz. Then, the next offset comb frequency (16 gigahertz) is used and the fine tuning loop returned to its 2.0 gigahertz starting point. Changes in loop 44 frequencies result in VCO 48 output changes from 17.5 to 18.5 gigahertz. Then, the next offset comb frequency (17 gigahertz) is used and the fine tuning loop similarly incremented to provide VCO 48 output changes from 18.5 to 19.5 gigahertz. It should, of course, be understood that these particular frequencies are given by way of example only. However, it is believed that the present invention finds particular utility where the incoming receive signal is upconverted (i.e. in mixer 18) with frequencies above 10 gigahertz.

It should be appreciated that the receiver 10 of the present invention includes two signal paths labeled path 1 and path 2 from VCO 48. Each path contains substantially the same noise and drift. This noise consists of not only noise due to the VCO 48 itself but also will contain noise contribution from the detector 66 and other components in the phase locked loop circuit 40. Thus, the resultant phase noise spectrum in both paths 1 and 2 contain more noise than just due to the gallium arsenide VCO 48 alone. The cancellation process operates on the entire composite spectrum and therefore reduces the noise due to many other sources than the VCO itself. Those sources of noise that do not get cancelled and therefore are present at the receiver output 14 include the noise of the fixed frequency offset combs 42 and the low frequency silicon phase locked loop circuit 44. However, both of these functions can be generated with very little noise in practice because noise in fixed frequency generators are easily filterable and silicon VCO's used in fine tuning loop 44 inherently have very low noise.

The various advantages will become apparent to those skilled in the art after a study of the foregoing specification, drawing and following claims.

What is claimed is:

1. In a multi-conversion receiver having first and second oscillators for upconverting and downconverting a received signal, the improvement comprising:
   first means for impressing the frequency and noise and drift generated by the first oscillator onto the received signal thereby resulting in a noise and drift impressed received signal;
   second means for impressing said noise and drift created in the first oscillator onto the frequency generated by the second oscillator thereby resulting in a noise and drift impressed frequency from the second oscillator; and
   third means for subtracting the noise and drift impressed frequency of the second oscillator from the noise and drift impressed received signal whereby the resultant receiver output is substantially free of noise and drift created by the first oscillator thereby permitting the use of efficient but noisy first oscillators.

2. The improvement of claim 1 wherein said first oscillator includes a voltage controlled oscillator having at least one gallium arsenide device.

3. The improvement of claim 2 which further comprises:
   means for changing the frequency of the voltage controlled oscillator while maintaining the frequency of said second oscillator substantially constant.

4. The improvement of claim 2 wherein said gallium arsenide device is part of a phase locked loop network.

5. The improvement of claim 4 which further comprises:
   comb generator means for providing a plurality of preselected fixed frequencies in relatively large increments; and
   fine tuning loop means providing a source of variable frequency signals in smaller increments than that provided by the comb generator means.

6. A method of cancelling noise and drift in a receiver using first and second local oscillators for upconverting and downconverting a received signal, said method comprising:
   impressing a selected frequency generated by the first local oscillator together with noise and drift generated thereby onto the received signal;
   impressing the noise and drift generated by the first local oscillator onto the frequency generated by the second local oscillator; and
   subtracting the noise and drift impressed frequency of the second local oscillator from the noise and drift impressed received signal to thereby provide the receiver with an output signal substantially free of noise and drift created by the first local oscillator.

7. The method of claim 6 including:
   using a gallium arsenide voltage controlled oscillator to provide a range of frequencies above 10 gigahertz together with the noise generated thereby to upconvert the received signal.

8. The method of claim 7 including:
   maintaining the frequency generated by the second local oscillator substantially constant while varying the frequency generated by the gallium arsenide voltage controlled oscillator.

9. The method of claim 8 which further comprises:
   using the gallium arsenide voltage controlled oscillator as part of a phase locked loop network; and
   coupling an output of the phase locked loop network to a output of the second local oscillator.

10. The method of claim 9 which further comprises:
    using a second phase locked loop circuit consisting primarily of silicon components to control fine tuning of the gallium arsenide voltage controlled oscillator.

11. The method of claim 10 which further comprises:
    using an offset comb generator providing a plurality of fixed frequencies, higher than the frequencies provided by the second phase locked loop circuit, for controlling larger increments of frequency changes in the gallium arsenide voltage controlled oscillator.

12. A communications receiver having a tuning section for upconverting and downconverting a received signal, said receiver comprising:
    a first mixer having a first input coupled for receipt of the received signal and a second input;
    a phase locked loop circuit including a gallium arsenide voltage controlled oscillator (VCO) having an input and two outputs, one of the outputs being coupled to the second input of the first mixer; the other output of the VCO being connected to an input of a second mixer, offset comb frequency generator means connected to a second input of the second mixer for selectively providing a plurality of fixed frequency signals thereto; said second mixer having an output coupled to an input of a third mixer; fine tuning loop means providing selected output frequencies less than 10 gigahertz, said fine tuning loop means being coupled to another input of the third mixer; an output of the third mixer being coupled to one input of a phase detector, another input of the phase detector being provided with a given lock frequency, an output of the phase detector being coupled to said input of the VCO;
    second local oscillator means providing a fixed frequency signal;
    fourth mixer means having an input coupled to an output of the second oscillator means and having an input coupled to an output of the third mixer, the fourth mixer having an output; and
    fifth mixer means having one input coupled to an output of the first mixer and a second input coupled to an output of the fourth mixer, said fifth mixer being adapted to subtract the output 30 of the fourth mixer from the output 32 of the first mixer whereby the output of the fifth mixer substantially cancels noise and drift associated with at least the gallium arsenide voltage controlled oscillator.

13. The receiver of claim 12 wherein said gallium arsenide voltage controlled oscillator generates frequencies in excess of 10 gigahertz.

14. The receiver of claim 13 wherein the offset comb generator provides frequencies in increments of about one gigahertz.

15. The receiver of claim 14 wherein said fine tuning loop comprises active components made of silicon.

* * * * *